United States Patent [19]

Ducourant et al.

[11] Patent Number: 4,757,478
[45] Date of Patent: Jul. 12, 1988

[54] DECODER CIRCUIT FOR A STATIC RANDOM ACCESS MEMORY

[75] Inventors: Thierry Ducourant, Crosne; Bertrand Gabillard, Paris, both of France

[73] Assignee: U.S. Philips Corporation, New York, N.Y.

[21] Appl. No.: 940,475

[22] Filed: Dec. 10, 1986

[30] Foreign Application Priority Data

Dec. 17, 1985 [FR] France ............................ 85 18675

[51] Int. Cl.$^4$ .................................................. G11C 8/00
[52] U.S. Cl. ..................................... 365/230; 307/449
[58] Field of Search ............... 365/154, 230; 307/449, 307/463

[56] References Cited

U.S. PATENT DOCUMENTS

| | | | |
|---|---|---|---|
| 3,863,230 | 1/1975 | Regitz et al. | 365/230 |
| 3,995,171 | 11/1976 | Sonoda | 307/449 |
| 4,446,386 | 5/1984 | Kurafuji | 307/449 |
| 4,563,598 | 1/1986 | Oritani | 307/449 |

Primary Examiner—James W. Moffitt
Attorney, Agent, or Firm—Jack Oisher; Steven R. Biren

[57] ABSTRACT

An elementary decoder circuit for a monolithically integrated static random access memory is constructed by means of gallium arsenide field effect transistors and formed by a NOR-gate whose n inputs receive the n coded addressing signals $a_1, a_2, \ldots, a_n$ of the memory, or their complements, and whose output supplied a signal which is applied to the upper transistor of a push-pull stage as well as a complementary signal, obttained via an inverter transistor, which is applied to the lower transistor of the push-pull stage. The junction point of the two transistors of the push-pull stage supplies the word line signal of the memory, and the two transistors of the push-pull stage are of the enhancement type, like the transistors of the NOR-gate, the output signal of the NOR-gate being applied to the input of the inverter transistor via a level shifting diode so that the biasing of the transistors of the push-pull stage results in an extremenly fast data transfer from the output of the NOR-gate to the word line.

4 Claims, 1 Drawing Sheet

DECODER CIRCUIT FOR A STATIC RANDOM ACCESS MEMORY

BACKGROUND OF THE INVENTION

The invention relates to an elementary decoder circuit for a monolithically integrated static random access memory constructed by means of gallium arsenide field effect transistors and formed by a NOR-gate whose n inputs receive the n coded addressing signals $a_1, a_2, \ldots, a_n$ of the memory, or their complements, its output supplying a signal which is applied to the upper transistor of a push-pull stage as well as a complementary signal which is obtained via an inverter transistor and which is applied to the lower transistor of the push-pull stage, the junction point of the two transistors of the push-pull stage supplying the word line of the memory.

The present invention is used for the construction of ultrafast cache memories for large computers used in the field of astronomy and meteorology as well as for the processors of flight simulators for the display of high-resolution digital images.

The memory circuits are almost always organized in the form of a network of cells in a matrix structure. Each cell, corresponding to a binary digit or bit, is situated at the intersection of two lines: a horizontal line or row and a vertical line or column. The lines correspond to the memory addresses and are generally denoted as $X_1, X_2, \ldots, X_n$ for the rows and $Y_1, Y_2, \ldots, Y_n$ for the columns. Each memory cell thus has a unique address and can be selected by simultaneous activation of the appropriate row and column. After selection of the cell, the data can be transferred to or extracted from the cell by way of a pair of lines which are common to all cells and which are referred to as bit lines.

The number of address lines required for operation of a memory having a matrix structure amounts to $2N^{\frac{1}{2}}$, N being the number of memory points or memory bits. Such a number of address lines would restrict the capacity of the memory; therefore, it is necessary to use a decoder circuit in order to reduce the number of address lines. For a memory which consists of $2^n$ rows and $2^p$ columns and whose capacity thus amounts to $N=2^{(n+p)}$ bits, the decoder circuit for the row addresses will comprise $2^n$ elementary decoder circuits, each of which comprises n inputs whereto the binary coded addresses $a_1, a_2, \ldots, a_n$ are applied, while the decoder circuit for the column addresses will comprise $2^p$ elementary decoder circuits, each of which comprises p inputs whereto the p binary coded column addresses $b_1, b_2, \ldots, b_n$ are applied.

Each output of the elementary decoder, or word line, carries the binary decoded signal formed by one of the $2^n$ or $2^p$ feasible logic combinations of said inputs.

It will be known that static random access memories differ from other types of memory on the one hand because the data can be read or written therein at random and on the other hand because the data will be sustained in the memory for as long as the power supply and the external clock signals, if any, are sustained. Therefore, the external clock signals are not obligatory.

In order to realize cache memories for the described application, use must be made of ultrafast static random access memories having a low power consumption and a monolithically integrated construction. Therefore, a technology involving gallium arsenide field effect transistors is extremely attractive for realizing such circuits, because the particularly high electronic mobility in this material enables extremely short transit times to be achieved in the transistors. Among the different technologies which can now be carried out by means of gallium arsenide transistors, the technology which is referred to as DCFL (Direct Coupled Field effect transistor Logic) is the one which offers the lowest power consumption as well as the highest integration density in combination with a very high speed. The elementary logic gate, or inverter, realized by means of this technology is composed of an enhancement-type field effect transistor (cut off voltage $V_T \geq 0$) which is associated with a load, and outputs a signal which is compatible with the input of the next logic gate.

From a publication by M. Ino et al (Musashino Electrical communication Laboratory) published in "IEEE GaAs I.C. Symposium 1982" and entitled "GaAs 1 Kb Static RAM with E/D MESFET DCFL" it is known to construct a decoder circuit for a static random access memory which is monolithically integrated on a gallium arsenide (GaAs) substrate and which is composed of field effect transistors (MESFET; Metal Semiconductor Field Effect Transistor). A decoder circuit as described in the cited document and illustrated in FIG. 1 on page 4 thereof is composed of elementary decoder circuits. Each elementary decoder is essentially formed by a NOR-gate having n inputs, each of which is intended to receive one of the binary coded address input signals $a_1, a_2, \ldots, a_n$, expressed in the form of a signal or its complement, formed before being input into the decoder via an intermediate circuit (Address Buffer) so as to obtain on the output of the NOR-gate a combination of binary digits produced by the logic NOR-function and forming the address of a row or a column.

This NOR-gate consists of enhancement-type gallium arsenide field effect transistors which have a cut off voltage $V_T \geq 0$, i.e. transistors which are conductive only when the voltage applied to their gate does not exceed this voltage $V_T$. The transistors forming this NOR-gate are connected in parallel, their common source being connected to ground while their common drain is connected to the short-circuited gate-source of a depletion-type transistor which is used as the active load.

When the value of the output signal of the NOR-gate changes from 0 to 1 or from 1 to 0, the associated voltage will charge or discharge the output capacitance of the circuit. In order to obtain equivalent charging and discharging times for this capacitance, the output signal of the NOR-gate is applied to the input of an inverter stage so that the actual output signal as well as its complement are simultaneously obtained, after which each of these signals is applied to a respective input of the two inputs of a push-pull stage. The inverter stage used includes an enhancement-type transistor as the inverter transistor and a depletion-type transistor as the load. The push-pull stage also includes an enhancement-type transistor which is connected to ground in a commen source connection, in series with a depletion-type transistor which is connected to the supply voltage in a common drain connection.

According to the present state of the manufacturing technique for gallium arsenide circuits, however, the manufacturing efficiency, that is to say the percentage of circuits produced which actually operate, is very low: in the order of from 4 to 10%. After the manufacture of a circuit, the circuit is tested and must be rejected if it does not operate correctly. This low efficiency is due to the technological difficulties still encountered. Therefore, in order to improve the manufacturing efficiency of one type of circuit it is necessary to simplify the manufacture of this type of circuit.

In the case of the decoder circuit, for example it is important to replace the depletion-type transistors forming the active loads by resistive loads which are easier to realize from a technological point of view. On the other hand it is also important to replace the depletion-type transistor of the push-pull stage by an enhancement-type transistor so that only a single type of transistor need be used for the manufacture of such a circuit.

However, if only a pure and simple transposition of the circuit disclosed in the cited document is envisaged by the method described above, the following problem is also encountered: between the output of the NOR-gate and ground there is formed a parasitic diode due to the fact that the inverter transistor whereto the output voltage is applied is of the Schottky type. This parasitic diode effect prevents the output signal of the NOR-gate from reaching a sufficiently high level for the unblocking of the transistor of the push-pull stage whereto it is applied. The push-pull stage is thus rendered ineffective and in these circumstances it will be time consuming and difficult to charge the output capacitance of the elementary decoder.

SUMMARY OF THE INVENTION

The present invention allows for the described drawbacks to be eliminated. An elementary decoder circuit for a monolithically integrated static random access memory constructed by means of gallium arsenide field effect transistors and formed by a NOR-gate whose n inputs receive the n coded addressing signals $a_1, a_2, \ldots, a_n$ of the memory, or their complements, its output supplying a signal which is applied to the upper transistor of a push-pull stage, as well as a complementary signal which is obtained via an inverter transistor and which is applied to the lower transistor of the push-pull stage, the junction point of the two transistors of the push-pull stage supply the word line signal of the memory, characterized in that the two transistors of the push-pull stage are of the enhancement type, like the transistors of the NOR-gate, the output signals of the NOR-gate being applied to the input of the inverter transistor via a level shifting diode so that the biasing of the transistors of the push-pull stage results in an extremely fast data transfer from the output of the NOR-gate to the word line.

In accordance with the invention the decoder circuit thus offers inter alia the following advantages:

it is realized entirely by means of transistors of a single type (enhancement type) due to the fact that both transistors of the push-pull stage are of this type, and with a single power supply $V_{DD}$;

it is realized by means of a minimum number of active elements. Actually, the circuit in accordance with the invention enables the use of only a single NOR-gate having n inputs; nevertheless, the output signal of this gate can still reach a value which suffices for biasing the upper transistor of the push-pull stage with a maximum efficiency. Moreover, the loads are of the resistive type.

BRIEF DESCRIPTION OF THE DRAWING

The invention will be described hereinafter with reference to the accompanying drawings, in which.

DESCRIPTION OF THE PREFERRED EMBODIMENTS

Figure 1:
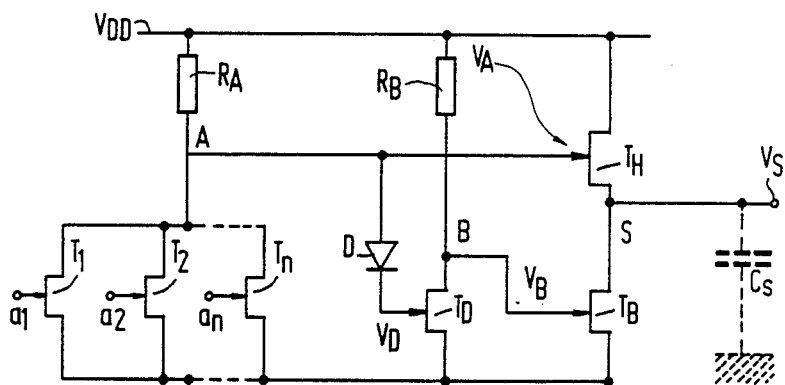
FIG. 1 shows the elementary decoder circuit in accordance with the invention.

As appears from FIG. 1, the elementary decoder circuit in accordance with the invention includes a NOR-gate which is formed by n enhancement-type field effect transistors, n being the number of coded memory address signals. The n inputs of the NOR-gate receive the n coded address signals in order to form the combination representing the address of a row or a column. A load $R_A$ is connected to the supply voltage $V_{DD}$.

The load of the NOR-gate is formed by a resistance $R_A$ realized by implantation of doping materials in the GaAs substrate. The transistors of the NOR-gate are connected in a common source connection which is connected to ground. The output signal $V_A$ of the NOR-gate appears at the junction point A of the drains of the transistors and the load R.

In accordance with the invention, the signal $V_A$ is applied directly to the gate of the upper transistor $T_H$ of a push-pull stage. The transistor $T_H$ is of the enhancement type. Its drain is connected to the potential $V_{DD}$ and its source S is connected to the drain of the lower transistor $T_B$ of the push-pull stage.

The junction S of the two transistors of the push-pull stage supplies the output signal $V_S$ of the elementary decoder or the word line.

The gate of the lower transistor $T_B$ receives the complementary signal $V_B$ from the output $V_A$ of the NOR-gate via an inverter stage which is formed by the enhancement-type transistor $T_D$ loaded by the resistance $R_B$.

As has already been mentioned, if the signal $V_A$ is applied directly to the gate of the inverter transistor as shown in the cited document describing the state of the art, the level of the signals supplied will not be sufficient for correct biasing of the transistors of a push-pull stage which is formed exclusively by enhancement-type transistors. Therefore, the operation of the circuit would be undesirably slow.

Therefore, in accordance with the invention the signal $V_A$ is applied to the input of the inverter stage $T_D$ via a diode D.

The circuit thus operates as follows: while changing from 0 to 1, the output signal $V_S$ charges a fictitious capacitance $C_S$.

When all inputs of the NOR-gate are 0, the voltage $V_A$ on the junction point A can increase substantially to the value of the voltage $V_{DD}$. The transistor $T_H$ whose gate receives this voltage $V_A$ is then turned on. The output capacitance $C_S$ is charged by the voltage $V_S$ which becomes almost equal to the value $V_{DD}$; at the same time, the transistor $T_D$ of the inverter gate is strongly biased and the potential of the bridge B assumes a value near ground potential. In these circumstances the transistor $T_D$ is cut off and the capacitance $C_S$ is very efficiently charged.

One of the advantages of the use of a shift diode is that, because the diode has a large parallel capacitance, it transfers the leading and trailing edges observed at the point A to the point D substantially without delay.

However, when one of the inputs of the NOR-gate becomes 1, so that the value of the voltage $V_A$ becomes substantially zero, one of the transistors whereto the signal "1" is applied is turned on. A voltage $V_A \simeq 0$ is then applied to the gate of the transistor $T_H$ which is thus cut off. Similarly, the transistor $T_D$ is turned off and the resistance $R_B$, no longer being traversed by any current, assumes the potential $V_B$ approximating the saturation voltage of the gate-source diode of the lower transistor of the push-pull stage $T_B$. This stage is then highly conductive and, while discharging the capacitance $C_S$, rapidly brings the potential $V_S$ to a value near $V_S = 0$.

It will be apparent that the use of at least one diode for shifting the electrical levels enables a rise to substantially the value of the positive supply voltage $V_{DD}$, provided that the value thereof amounts to exactly twice the value of the shift voltage of the diode D which is preferably of the Schottky type in the present embodiment.

For a shift voltage in the order of 0.7 V for the diode D, the value of the supply voltage $V_{DD}$ will be chosen in the order of 1.5 V.

It is to be noted that this value, resulting in optimum operation in accordance with the invention, can be used for all the other circuits of the memory assembly which thus operates with a single power supply.

Therefore, it is no longer necessary to insert a capacitance of the type of the capacitance 68 described in U.S. Pat. No. 3,863,230 between the junction point A of the first stage of the elementary decoder and the junction point B of the second stage, in order to ensure correct biasing of the transistor $T_H$. Actually, the resistance $R_B$ connected to the supply voltage $V_{DD} = 1.5$ V then suffices for proper biasing of this transistor.

Contrary to the European Patent Application No. Ep-0 140 413, it is no longer necessary to use a second NOR-gate which would double the number of transistors, and hence the surface area occupied by the integrated circuit, in order to solve the problem imposed by the level by the signals applied to the push-pull stage.

Figure 2:
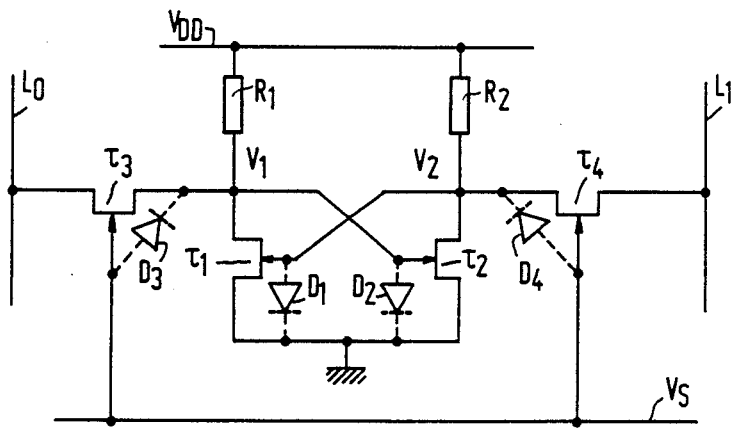
FIG. 2 shows the memory cell of the static random access memory associated with the elementary decoder circuit in accordance with the invention.

As appears from FIG. 2, the memory cell is formed by two transistors $\tau_1$ and $\tau_2$ which are arranged as a bistable and which are powered, via the resistances $R_1$ and $R_2$, respectively, by the supply voltage $V_{DD}$. As a result of the presence of the fictitious diodes $D_1$ and $D_2$ between the respective gates of the transistors and ground, because the transistors $\tau_1$ and $\tau_2$ are of the Schottky type, the signals $V_1$ and $V_2$ on the drains of these transistors are clipped to a value of 0.7 V.

In these circumstances, it suffices for the supply voltage of the memory cells to exceed 0.7 V in order to ensure correct operation of the memory.

The value $V_{DD} = 1.5$ V, being the supply voltage already used according to the invention, thus represents a particularly attractive value. Thus, the high level, or "1" level, of the signal $V_S$ (the output signal in accordance with the invention) does not have a critical value, because it is automatically clipped to 0.7 V by the fictitious diodes $D_3$ and $D_4$ occurring between the gate of the access transistors $\tau_3$ and $\tau_4$, being of the Schottky type, and ground (FIG. 2).

Figure 3:
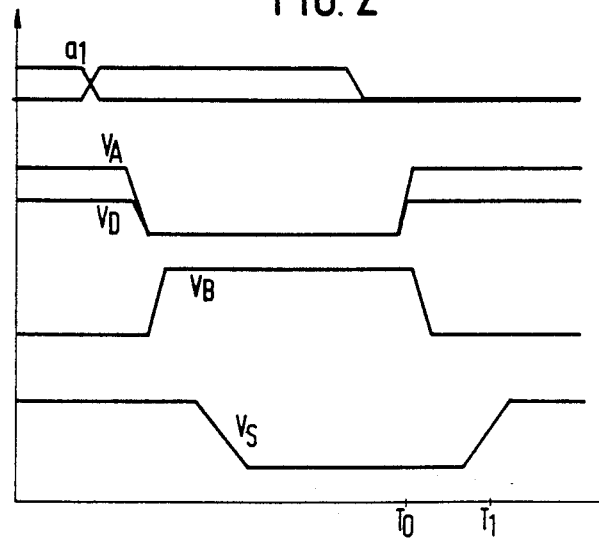
FIG. 3 shows the propagation diagram of the signal $V_S$ on the word line with respect to the signal $a_i$ for selecting addresses $a_1, a_2, \ldots, a_n$ as a function of the time t in the elementary decoder circuit in accordance with the invention.

The signal propagation diagram is shown in FIG. 2. The word line corresponding to the memory cell considered is activated only when all address combinations $a_1, \ldots, a_n$ applied to the input terminals of the circuit in accordance with the invention have the value "0", corresponding to the instant $T_0$ in FIG. 3. The output voltage $V_S$ subsequently increases to "1" at the instant $T_1$. Therefore, the access time of the memory cell amounts to:

$$T_{access} = T_1 - T_0.$$

In one embodiment of the circuit in accordance with the invention, the resistances and transistors have the following characteristics:

| | |
|---|---|
| Resistance $R_A = 3.5$ kΩ, $R_B = 5.5$ kΩ | |
| Length of the gate of the transistors | $1 = 0.7$ μm |
| Width of the transistors of the NOR-gate | $1 = 7$ μm |
| Width of the transistors $T_D$ and the diode $D_1$ | $1 = 7$ μm |
| Width of the transistor $T_H$ | $1 = 20$ μm |
| Width of the transistor $T_B$ | $1 = 20$ μm |
| Supply voltage | $V_{DD} = 1.5$ V. |
| Cut-off voltage | $V_T = 0.05$ V. |

Moreover, in the embodiment of the memory cell the resistances and transistors have the following characteristics:

| | |
|---|---|
| Load resistance $R_1 = R_2 = 100$ kΩ | |
| Length of the gate of the transistors | $L = 0.7$ μm |
| Width of the transistors $\tau_1$ and $\tau_2$ | $1 = 7$ μm |
| Width of the transistors $\tau_3$ and $\tau_4$ | $1 = 3$ μm |
| Cut-off voltage $V_T = 0.05$ V. | |

In these circumstances a propagation time of 0.1 ns will be achieved in the elementary decoder circuit in accordance with the invention.

In an application for a static random access memory, the decoder circuit of this memory is composed of $2^n$ identical elementary decoder circuits in accordance with the invention for activating the $2^n$ rows of the memory, and $2^p$ identical elementary decoder circuits in accordance with the invention for activating the $2^p$ columns of the memory.

It will be apparent that the use of the invention is not restricted to cache memories realized by means of field effect transistors integrated on a gallium arsenide substrate and that many alternatives are possible, notably as regards the capacity and the transistor characteristics, without departing from the scope of the present invention.

We claim:

1. An elementary decoder circuit for a monolithically integrated static random access memory having gallium arsenide field effect transistors and comprising a push-pull stage having an upper and a lower transistor, an inverter transistor, a level-shifting diode, and a NOR-gate whose n inputs receive n coded addressing signals $a_1, a_2, \ldots, a_n$ of the memory, or their complements, the NOR-gate output supplying a signal which is applied to the upper transistor of the push-pull stage, as well as a complementary signal which is obtained from said inverter transistor and which is applied to the lower transistor of the push-pull stage, the junction point of the two transistors of the push-pull stage supplying the word line signal of the memory, characterized in that the two transistors of the push-pull stage and the transistors of the NOR-gate are of the enhancement type, the output signals of the NOR-gate being applied to the input of the inverter transistor via said level-shifting diode so that the biasing of the transistors of the push-pull stage results in an extremely fast data transfer from the output of the NOR-gate to the word line.

2. A circuit as claimed in claim 1, characterized in that the load of the NOR-gate and the load of the inverter transistor are of the resistive type.

3. A circuit as claimed in claim 1 or 2, characterized in that the d.c. supply voltage of the circuit is substantially twice the shift voltage of the diode.

4. A static random access memory, characterized in that it comprises $2^n$ identical elementary decoders as claimed in claim 1 or 2 for activating the $2^n$ memory rows, and also comprises a plurality of such identical elementary decoders for activating the columns of the memory.

* * * * *